(12) United States Patent
Kawashima

(10) Patent No.: US 9,811,693 B2
(45) Date of Patent: Nov. 7, 2017

(54) WIRING BOARD AND METHOD FOR RECOGNIZING CODE INFORMATION THEREOF

(71) Applicant: KYOCERA Circuit Solutions, Inc., Kyoto (JP)

(72) Inventor: Takafumi Kawashima, Kyoto (JP)

(73) Assignee: KYOCERA CORPORATION, Kyoto-shi, Kyoto (JP)

( * ) Notice: Subject to any disclaimer, the term of this patent is extended or adjusted under 35 U.S.C. 154(b) by 0 days.

(21) Appl. No.: 15/011,823

(22) Filed: Feb. 1, 2016

(65) Prior Publication Data

US 2016/0224811 A1    Aug. 4, 2016

(30) Foreign Application Priority Data

Feb. 3, 2015   (JP) ................ 2015-018976

(51) Int. Cl.
| | |
|---|---|
| *G06K 7/06* | (2006.01) |
| *H05K 1/02* | (2006.01) |
| *H05K 1/11* | (2006.01) |
| *H05K 1/18* | (2006.01) |

(52) U.S. Cl.
CPC ........... *G06K 7/065* (2013.01); *H05K 1/0268* (2013.01); *H05K 1/0298* (2013.01); *H05K 1/111* (2013.01); *H05K 1/113* (2013.01); *H05K 1/181* (2013.01); *H01L 2224/16225* (2013.01); *H05K 2201/0959* (2013.01); *H05K 2201/10674* (2013.01); *H05K 2201/10734* (2013.01)

(58) Field of Classification Search
CPC .............................. G06K 19/067; G06K 19/07

USPC ................ 235/441, 454, 462.09, 462.1
See application file for complete search history.

(56) References Cited

U.S. PATENT DOCUMENTS

| | | | | |
|---|---|---|---|---|
| 5,466,154 | A | * | 11/1995 | Thompson ........... G09B 21/003 434/114 |
| 2005/0199995 | A1 | * | 9/2005 | Nomoto .................. H01L 23/12 257/692 |
| 2005/0247481 | A1 | | 11/2005 | Chen et al. |
| 2008/0149732 | A1 | | 6/2008 | Lo et al. |

(Continued)

FOREIGN PATENT DOCUMENTS

| JP | 2005-167235 A | 6/2005 |
|---|---|---|
| TW | 200537998 A | 11/2005 |

(Continued)

OTHER PUBLICATIONS

Taiwan Office Action with English concise explanation, Taiwan Patent Application No. 105103107, dated Apr. 18, 2017, 15 pgs.

*Primary Examiner* — Daniel St. Cyr
(74) *Attorney, Agent, or Firm* — Volpe and Koenig, P.C.

(57) ABSTRACT

A wiring board of the present invention includes an insulating board including a core insulating plate and an insulating layer laminated on at least one surface of the insulating plate. A plurality of code information reading pads formed of a conductor layer are disposed on a surface of the insulating layer formed uppermost. A common conductor is disposed oppositely to the code information reading pads by interposing therebetween the insulating layer formed uppermost. At least one of the code information reading pads and the common conductor are electrically connected to each other through a via conductor penetrating through the insulating layer formed uppermost.

10 Claims, 5 Drawing Sheets

(56) References Cited

U.S. PATENT DOCUMENTS

| | | |
|---|---|---|
| 2008/0277144 A1 | 11/2008 | Chen et al. |
| 2011/0127882 A1* | 6/2011 | Aratake ................ G04G 5/002 310/321 |
| 2011/0156033 A1* | 6/2011 | Bintang ............ H01L 21/67294 257/48 |

FOREIGN PATENT DOCUMENTS

| | | |
|---|---|---|
| TW | 200829091 A | 7/2008 |
| TW | 2009922405 A | 5/2009 |

\* cited by examiner

WIRING BOARD AND METHOD FOR RECOGNIZING CODE INFORMATION THEREOF

BACKGROUND OF THE INVENTION

1. Field of the Invention

The present invention relates to a wiring board having code information with which it is possible to recognize, for example, product number and production history of the wiring board. The present invention also relates to a method for recognizing the code information about the wiring board.

2. Description of the Related Art

A compact wiring board for mounting a semiconductor element such as a semiconductor integrated circuit element is known as a wiring board. This type of wiring board is described in, for example, Japanese Unexamined Patent Publication No. 2005-167235. The compact wiring board is obtained by disposing a wiring conductor on the inside and surface of an insulating board having thereon a plurality of insulating layers laminated one upon another. The insulating layers are formed of a heat resistant electrical insulating material, for example, a thermosetting resin, such as epoxy resin. The wiring conductor is formed of a satisfactorily conductive material, such as copper.

A mounting portion for mounting a semiconductor element is disposed at a central portion on an upper surface of the insulating board. A plurality of circular semiconductor element connection pads formed of a part of the wiring conductor are arranged in a lattice pattern on the mounting portion. An electrode terminal of the semiconductor element is connected to the semiconductor element connection pads by flip-chip connection.

An external connection surface to be connected to an external electrical circuit board is formed on a lower surface of the insulating board. A plurality of circular external connection pads formed of a part of the wiring conductor are arranged in a lattice pattern over approximately the entire surface of the external connection surface. These external connection pads are connected to a wiring conductor of the external electrical circuit board with solder interposed therebetween. The semiconductor element connection pads and the external connection pads are electrically connected to each other in predetermined pairs with the wiring conductor lying inside the insulating board interposed therebetween.

In the wiring board as described above, the semiconductor element is mounted on the mounting portion, and the electrode terminal of the semiconductor element and the semiconductor element connection pads are flip-chip connected to each other. Thereafter, the semiconductor element is packaged by filling an insulating resin called under fill between the semiconductor element and the wiring board so as to establish a seal therebetween. The external connection pads of the wiring board having the semiconductor element packaged therein are connected to the wiring conductor of the external electrical circuit board with the solder interposed therebetween. Thus, the semiconductor element is electrically connected to the external electrical circuit board.

The compact wiring board may in some cases have code information for perceiving product number and production history of the wiring board. The code information is applied by, for example, forming a two-dimensional bar code on a surface of the wiring board by laser processing or the like. When forming the two-dimensional bar code on the surface of the wiring board by laser processing, an aggregation of dots constituting the two-dimensional bar code is disposed at a portion of the surface of the insulating board which is free of the wiring conductor. The code information is to be recognized by reading the aggregation of dots with an image recognition device.

However, the downsizing and higher-density wiring of the wiring board in recent years has made it difficult to satisfactorily ensure an area necessary to dispose the two-dimensional bar code as the aggregation of dots at the portion of the surface of the insulating board. It is also difficult to impart a high contrast to the two-dimensional bar code formed on the surface of the insulating board by laser processing. Consequently, the two-dimensional bar code may not be surely recognized with the image recognition device depending on the material and color tone of the insulating board, or laser processing conditions.

SUMMARY OF THE INVENTION

An embodiment of the present invention provides a wiring board having code information surely recognizable irrespective of size, material, color tone, or the like of the wiring board, and also provides a method for recognizing the code information.

The wiring board according to the embodiment of the present invention includes an insulating board including a core insulating plate and an insulating layer laminated on at least one surface of the insulating plate. A plurality of code information reading pads formed of a conductor layer are formed on a surface of the insulating layer formed uppermost. A common conductor is disposed oppositely to the code information reading pads by interposing therebetween the insulating layer disposed uppermost. At least one of the code information reading pads and the common conductor are electrically connected to each other through a via conductor penetrating through the insulating layer formed uppermost.

The method for recognizing a code information according to the embodiment of the present invention includes recognizing code information by detecting presence or absence of an electrical connection between the code information reading pad and the common conductor in the wiring board.

A method for recognizing a code information according to another embodiment of the present invention uses a wiring board in which a plurality of semiconductor element connection pads to be flip-chip connected to an electrode terminal of a semiconductor element are disposed on a surface of an insulating layer formed uppermost, and a part of the semiconductor element connection pads constitutes the code information reading pads. The method for recognizing the code information includes connecting the code information reading pad in the wiring board to the electrode terminal of the semiconductor element, and recognizing code information by taking presence or absence of an electrical connection between the code information reading pad and the common conductor, into the semiconductor element as data.

DESCRIPTION OF THE EMBODIMENTS

Figure 1A:
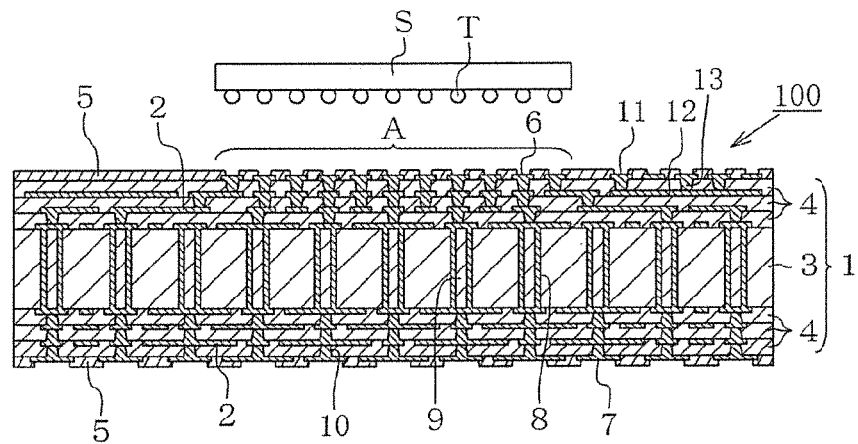
FIG. 1A is a schematic sectional view showing a wiring board according to a first embodiment of the present invention.

A wiring board according to a first embodiment of the present embodiment is described below with reference to FIGS. 1A and 1B. As shown in FIG. 1A, the wiring board 100 of the first embodiment includes an insulating board 1 and a wiring conductor 2. The insulating board 1 is obtained by laminating a plurality of insulating layers 4 formed of a thermosetting resin on upper and lower surfaces of a core insulating plate 3 obtained by impregnating a glass cloth with a thermosetting resin. A solder resist layer 5 is laminated on the uppermost insulating layer 4.

A mounting portion A for mounting a semiconductor element S is formed at a central portion on an upper surface of the insulating board 1. A plurality of semiconductor element connection pads 6 formed of a part of the wiring conductor 2 are formed on the mounting portion A. An electrode terminal T of a semiconductor element S is electrically connected to the semiconductor element connection pads 6 by flip-chip connection.

A lower surface of the insulating board 1 is an external connection surface for being connected to an external electrical circuit board. A plurality of external connection pads 7 formed of a part of the wiring conductor 2 are formed on a lower surface of the insulating board 1. The external connection pads 7 are electrically connected to a wiring conductor of the external electrical circuit board with solder interposed therebetween.

The insulating plate 3 is formed of an electrical insulating material in which a glass fabric having glass fiber bundles interweaved vertically and laterally is impregnated with a thermosetting resin, such as epoxy resin. The insulating plate 3 has a plurality of through holes 8 penetrating from upper surface to lower surface of the insulating plate 3 and having a diameter of approximately 0.1 to 1 mm. A part of the wiring conductor 2 is deposited on the upper and lower surfaces of the insulating plate 3 and an inner surface of each of the through holes 8.

The insulating plate 3 having the through holes 8 is produced by thermosetting an insulating sheet in which a glass fabric is impregnated with an uncured thermosetting resin, followed by drilling from the upper surface to lower surface of the insulating sheet. The wiring conductors 2 lying on the upper and lower surfaces of the insulating plate 3 are made into a predetermined pattern by sticking copper foil having a thickness of approximately 3 to 50 μm to the entire upper and lower surfaces of the insulating sheet for the insulating plate 3, and then curing the sheet, followed by etching of the copper foil. The wiring conductor 2 on the inner surface of the through holes 8 is formed by, after disposing the through holes 8 in the insulating plate 3, depositing a copper plating film having a thickness of approximately 3 to 50 μm on the inner surface of the through holes 8 by non-electrolytic plating method and electrolytic plating method.

The through holes 8 are filled with a hole-filling resin 9 containing a thermosetting resin, such as epoxy resin. The hole-filling resin 9 closes the through holes 8, thereby making it possible to form the wiring conductor 2 and the insulating layers 4 immediately above and immediately below the through holes 8. The hole-filling resin 9 is formed by filling an uncured pasty thermosetting resin into the through holes 8 by screen printing method, and then thermosetting this, followed by polishing of upper and lower surfaces thereof. A plurality of the insulating layers 4 are laminated one upon another on the upper and lower surfaces of the insulating plate 3 including the hole-filling resin 9.

Each of the insulating layers 4 laminated on the upper and lower surfaces of the insulating plate 3 is formed of a thermosetting resin, such as epoxy resin. Each of the insulating layers 4 has a thickness of approximately 20 to 60 μm and has a plurality of via holes 10 having a diameter of approximately 30 to 100 μm and penetrating from the upper surface to lower surface of each of the insulating layers 4. These insulating layers 4 provide an insulation clearance for high-density wiring of the wiring conductors 2. Stereoscopic high-density wiring is attainable by electrically connecting the overlying wiring conductor 2 and the underlying wiring conductor 2 with the via holes 10 interposed therebetween. These insulating layers 4 are formed by sticking an insulating film formed of an uncured thermosetting resin to a surface of the underlying insulating plate 3 or the insulating layer 4, and then thermosetting the thermosetting resin, followed by drilling of the via holes 10 by laser processing. The wiring conductor 2 deposited on the surface of each of the insulating layers 4 and in the via holes 10 is formed by a pattern formation method, such as well-known semi-additive method. Specifically, the wiring conductor 2 is formed by depositing a copper plating film having a thickness of approximately 5 to 50 μm to the surface of each of the insulating layers 4 and in the via holes 10 into a predetermined pattern.

The solder resist layers 5 laminated on the uppermost insulating layer 4 are formed of a thermosetting resin, such as epoxy resin. The overlying solder resist layer 5 has openings to respectively expose the semiconductor element connection pads 6. The underlying solder resist layer 5 has openings to respectively expose the external connection pads 7. The solder resist layers 5 function as a protective member that externally protects the wiring conductors 2 lying on the uppermost insulating layer 4, and also ensures satisfactory electrical insulation reliability between the wiring conductors 2 lying on the uppermost insulating layer 4. The solder resist layers 5 are formed, for example, by laminating a paste or film containing a thermosetting resin having photosensitivity, such as acrylic modified epoxy resin, on the uppermost insulating layer 4, and exposing and developing the paste or film into a predetermined pattern, followed by thermosetting.

Figure 1B:
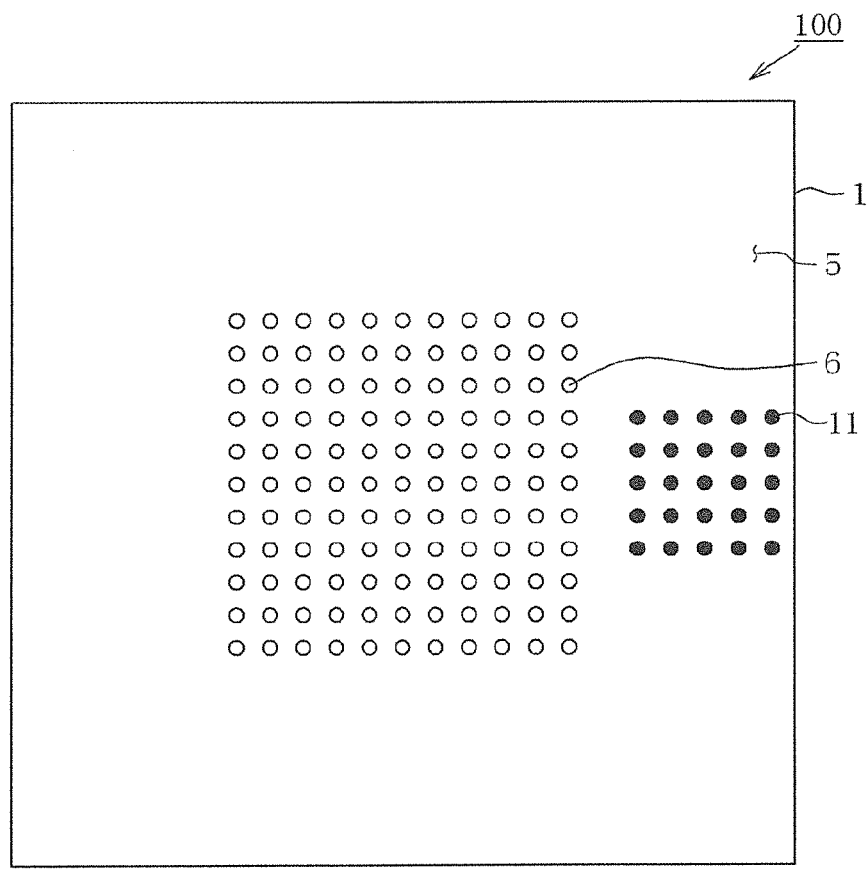
FIG. 1B is a schematic top view thereof.

As shown in FIG. 1B, the semiconductor element connection pads 6 have the circular shape and are arranged in the lattice pattern on the mounting portion A. The semiconductor element connection pads 6 have a diameter of approximately 50 to 100 μm. The semiconductor element connection pads 6 have an array pitch of 100 to 200 μm. The semiconductor element connection pads 6 are formed by exposing a part of the wiring conductor 2 lying on the uppermost insulating layer 4 into circular openings that are disposed in the solder resist layer 5 and have a diameter of 50 to 100 μm.

The external connection pads 7 lying on the lower surface of the insulating board 1 have a circular shape having a diameter of approximately 200 to 500 μm. The external connection pads 7 are disposed in a lattice pattern at an array pitch of 400 to 1000 μm over approximately the entire region of the lower surface of the insulating board 1. The external connection pads 7 are formed by exposing apart of the wiring conductor 2 lying on the lowermost insulating layer 4 into circular openings that are disposed in the solder resist layer 5 and have a diameter of 200 to 500 μm.

Code information reading pads 11 are disposed on the upper surface of the insulating board 1. In FIG. 1B, the code information reading pads 11 are indicated by portions highlighted in black in order to facilitate distinguishment from the semiconductor element connection pads 6. The code information reading pads 11 are formed of a part of the wiring conductor 2. Similarly to the semiconductor element connection pads 6, the code information reading pads 11 have a circular shape having a diameter of 50 to 100 μm. As shown in FIG. 1B, the code information reading pads 11 are disposed collectively in a lattice pattern at an array pitch of, for example, 100 to 200 μm in a side of the surface of the insulating board 1. These code information reading pads 11 are respectively exposed into circular openings that are disposed in the solder resist layer 5 and have a diameter of 50 to 100 μm.

A common conductor 12 is disposed below the code information reading pads 11 with the outermost insulating layer 4 interposed therebetween. The common conductor 12 is formed of a part of the wiring conductor 2. The common conductor 12 is formed with an electrically integrated pattern so as to lie immediately below all of the code information reading pads 11.

At least one of the code information reading pads 11 and the common conductor 12 are electrically connected to each other through a via conductor 13 penetrating through the outermost insulating layer 4. Whether to connect which one of the code information reading pads 11 to the common conductor 12 differs depending on the wiring board 100. Accordingly, inherent code information is assigned to each wiring board 100. The presence or absence of an electrical connection between each of the code information reading pads 11 and the common conductor 12 is to be detected by bringing a probe of an electric inspection device into contact with each of the code information reading pads 11. The code information about each wiring board 100 is thus recognized.

In the wiring board 100 according to the first embodiment, the code information reading pads 11 formed of the wiring conductor 2 are disposed on the surface of the uppermost insulating layer 4. The common conductor 12 is disposed so as to be opposed to the code information reading pads 11 with the uppermost insulating layer 4 interposed therebetween. At least one of the code information reading pads 11 and the common conductor 12 are electrically connected to each other through the via conductor 13 penetrating through the uppermost insulating layer 4. Therefore, the code information is surely recognized irrespective of material and color tone of the insulating board 1 by detecting the presence or absence of the electrical connection between the code information reading pad 11 and the common conductor 12.

The code information reading pads 11 are formed collectively in the side of the surface of the insulating board 1 in the wiring board 100 of the first embodiment. Therefore, when the presence or absence of the electrical connection between each of the code information reading pads 11 and the common conductor 12 is detected by bringing the probe of the electric inspection device into contact with the code information reading pad 11, if a probe of type that collectively comes into contact with the code information reading pads 11 is employed, this type of probe is downsizable. When using a probe of type that sequentially one after another comes into contact with the code information reading pads 11, a moving distance of the probe can be decreased, thus leading to shorter detection time.

Figure 2A:
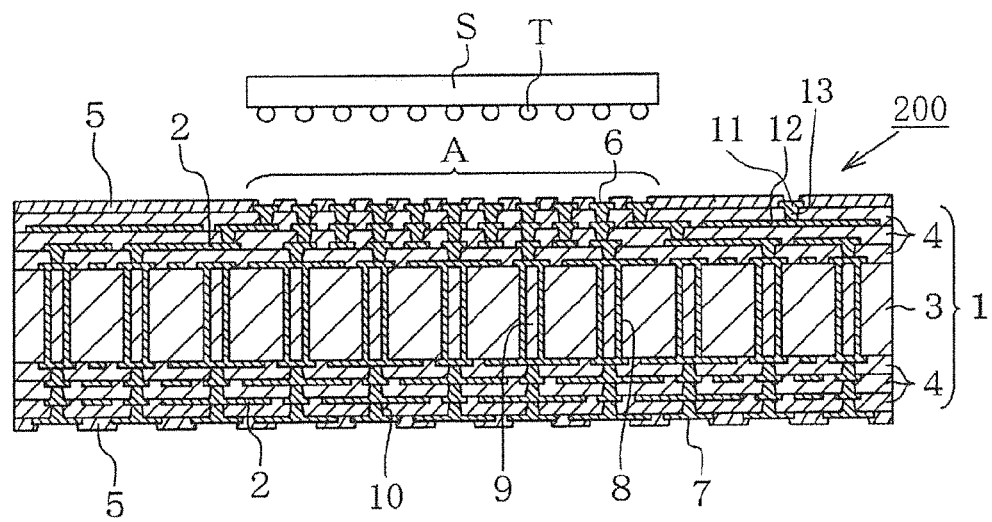
FIG. 2A is a schematic sectional view showing a wiring board according to a second embodiment of the present invention.
Figure 2B:
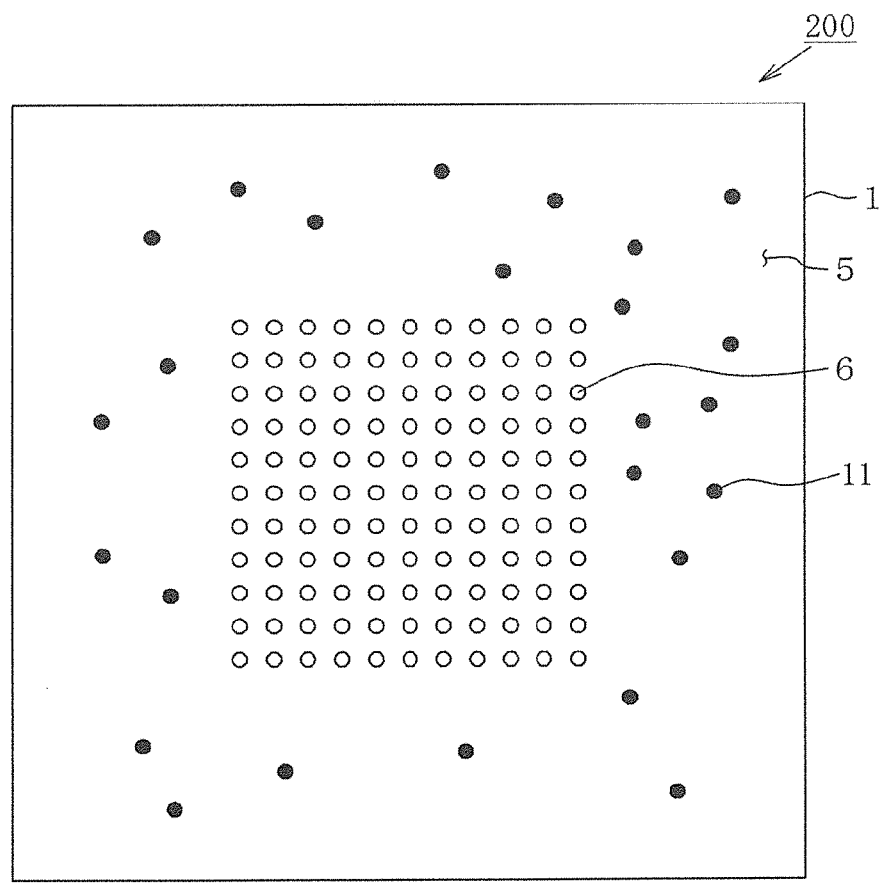
FIG. 2B is a schematic top view thereof.

A wiring board according to a second embodiment of the present invention is described below with reference to FIGS. 2A and 2B. Components similar to those of the foregoing wiring board 100 have similar reference characters, and their respective detailed descriptions are omitted. The wiring board 200 shown in FIGS. 2A and 2B differs from the wiring board 100 in the array of the code information reading pads 11. In the wiring board 200, the code information reading pads 11 are disposed dispersedly over a wide range on the surface of the insulating board 1. Other configurations are similar to those of the wiring board 100.

In the wiring board 200 of the second embodiment, the code information reading pads 11 are disposed dispersedly on the surface of the insulating board 1. As a result, code information is surely recognized even when it is difficult to ensure an area necessary to collectively dispose a plurality of code information reading pads 11.

Figure 3A:
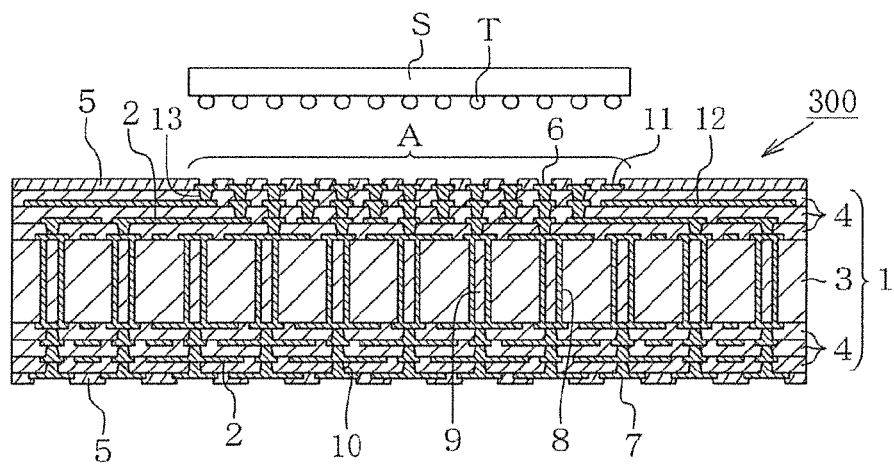
FIG. 3A is a schematic sectional view showing a wiring board according to a third embodiment of the present invention.
Figure 3B:
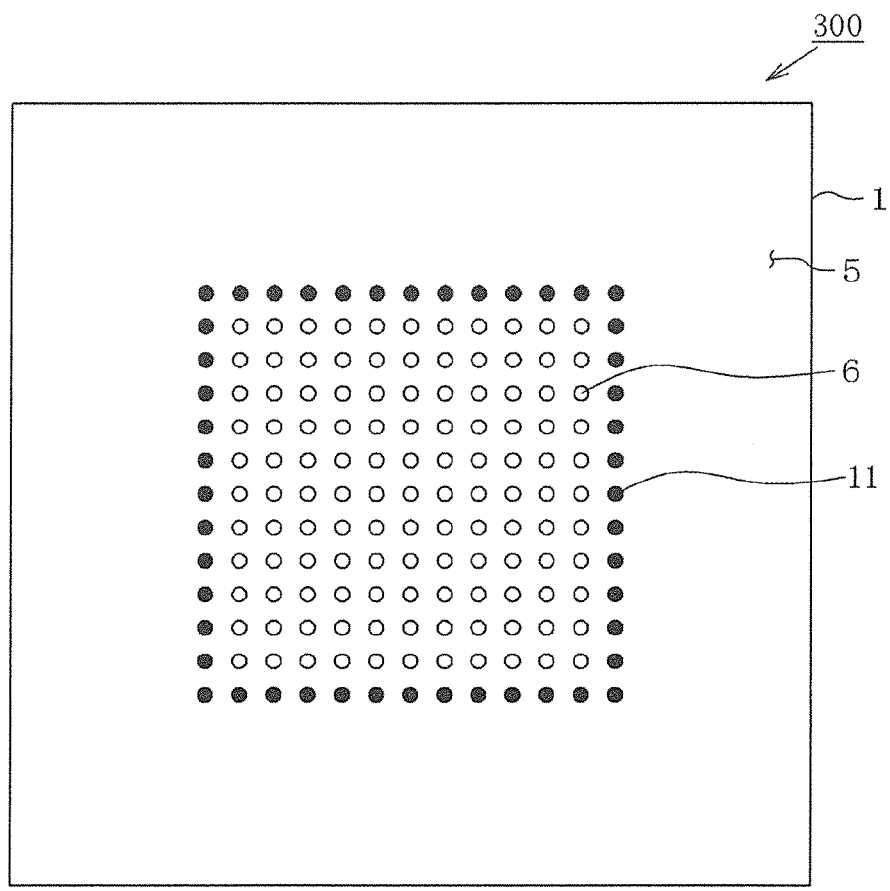
FIG. 3B is a schematic top view thereof.

A wiring board according to a third embodiment of the present invention is described below with reference to FIGS. 3A and 3B. Components similar to those of the foregoing wiring board 100 have similar reference characters, and their respective detailed descriptions are omitted. The wiring board 300 shown in FIGS. 3A and 3B differs from the foregoing wiring boards 100 and 200 in the array of the code information reading pads 11. In the wiring board 300, the code information reading pads 11 are formed of a part of the semiconductor element connection pads 6. Other configurations are similar to those of the wiring boards 100 and 200.

In the wiring board 300 according to the third embodiment, the code information reading pads 11 are formed of the part of the semiconductor element connection pads 6. Hence, upon connection of the code information reading pad 11 to the electrode terminal T of the semiconductor element S, the presence or absence of the electrical connection between the code information reading pad 11 and the common conductor 12 is taken into the semiconductor element S as data, making it possible to recognize code information. Therefore, the code information is surely recognized irrespective of the material and color tone of the insulating board 1.

With the wiring board 300 of the third embodiment, it is extremely easy to perform various kinds of managements by processing the code information taken into the semiconductor element S as the data by using a computer system. In the wiring board 300 of the third embodiment, the code information reading pads 11 may be disposed collectively in a side of an array of the semiconductor element connection pads 6, or may be disposed dispersedly over the entire array.

Thus, with the wiring boards according to any one of the embodiments of the present invention, the code information reading pads formed of the conductor layer and the common conductor are disposed oppositely to each other with the insulating layer interposed therebetween, and at least one of the code information reading pads and the common conductor are electrically connected to each other through the via conductor penetrating through the insulating layer. Hence, the code information is surely recognized irrespective of the material and color tone of the insulating board 1 by detecting the presence or absence of the electrical connection between the code information reading pad and the common conductor. Further, even when it is difficult to ensure the area necessary to collectively dispose the code information reading pads, it is possible to dispersedly dispose the code information reading pads on the insulating board. Hence, the code information is surely recognized by detecting the presence or absence of the electrical connection between these code information reading pad and the common conductor.

With a method for recognizing a code information according to an embodiment of the present invention, code information is surely recognized irrespective of the material and color tone of the insulating board by detecting the presence or absence of the electrical connection between the code information reading pad and the common conductor. Even when it is difficult to ensure the area necessary to collectively dispose the code information reading pads, it is possible to dispersedly dispose the code information reading pads on the insulating board. Hence, the code information is surely recognized by detecting the presence or absence of the electrical connection between these code information reading pads and the common conductor.

The present invention is not limited to the foregoing first to third embodiments, and various modifications are possible as long as they are within the scope of the claims.

Figure 4A:
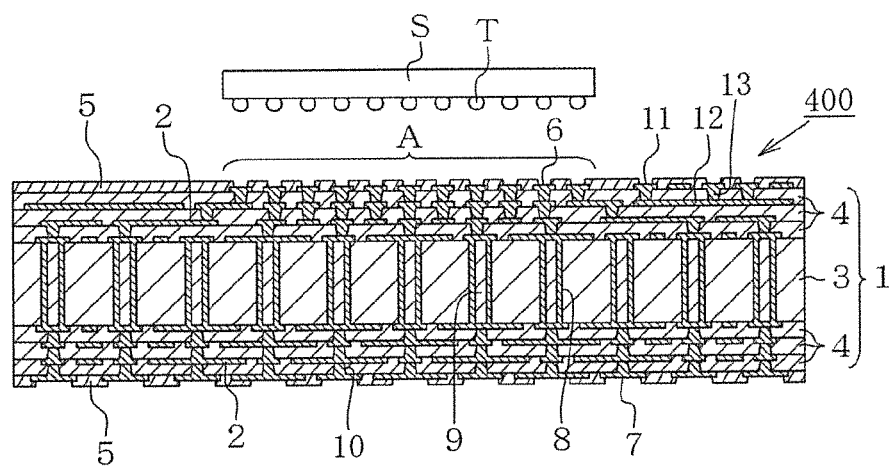
FIG. 4A is a schematic sectional view showing a wiring board according to a fourth embodiment of the present invention.
Figure 4B:
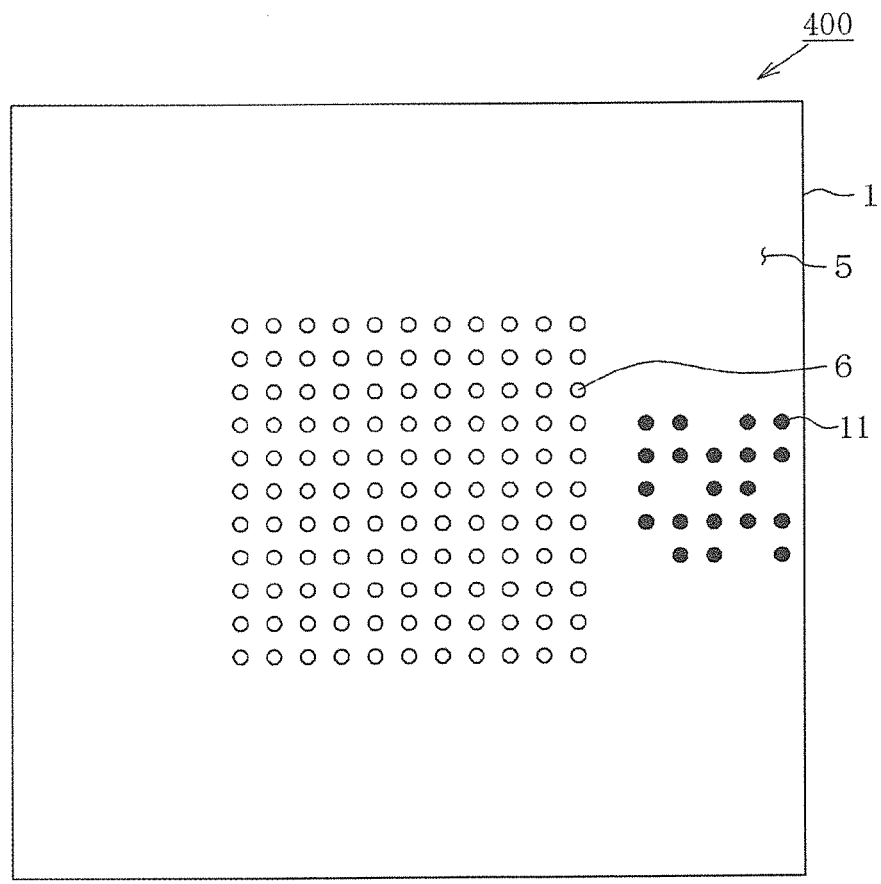
FIG. 4B is a schematic top view thereof.

For example, with the foregoing first to third embodiments, all of the code information reading pads 11 are exposed into the openings disposed in the solder resist layer 5. Alternatively, only the code information reading pad 11 not electrically connected to the common conductor 12 may be fully covered with the solder resist layer 5 as in a wiring board 400 according to a fourth embodiment shown in FIGS. 4A and 4B. This makes it possible to recognize code information with a method other than detecting the presence or absence of the electrical connection between the code information reading pad 11 and the common conductor 12. That is, the code information is recognized by reading the presence or absence of the solder resist layer 5 on the code information reading pad 11 with an image recognition device.

Figure 5A:
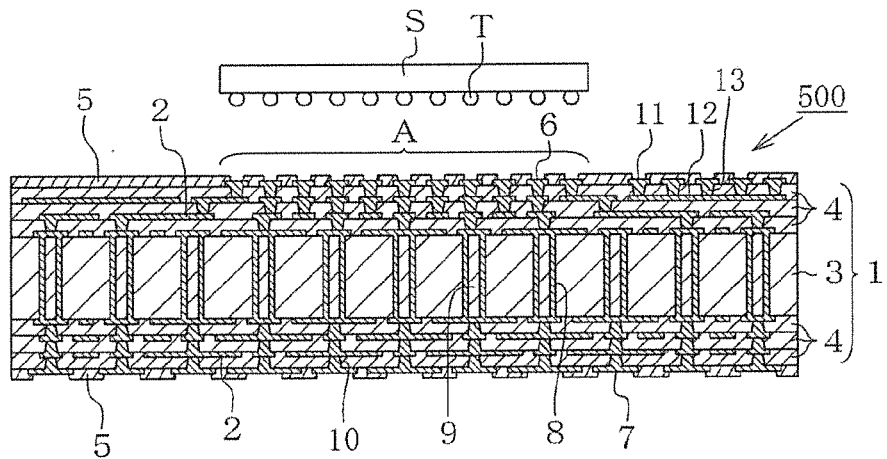
FIG. 5A is a schematic sectional view showing a wiring board according to a fifth embodiment of the present invention.
Figure 5B:
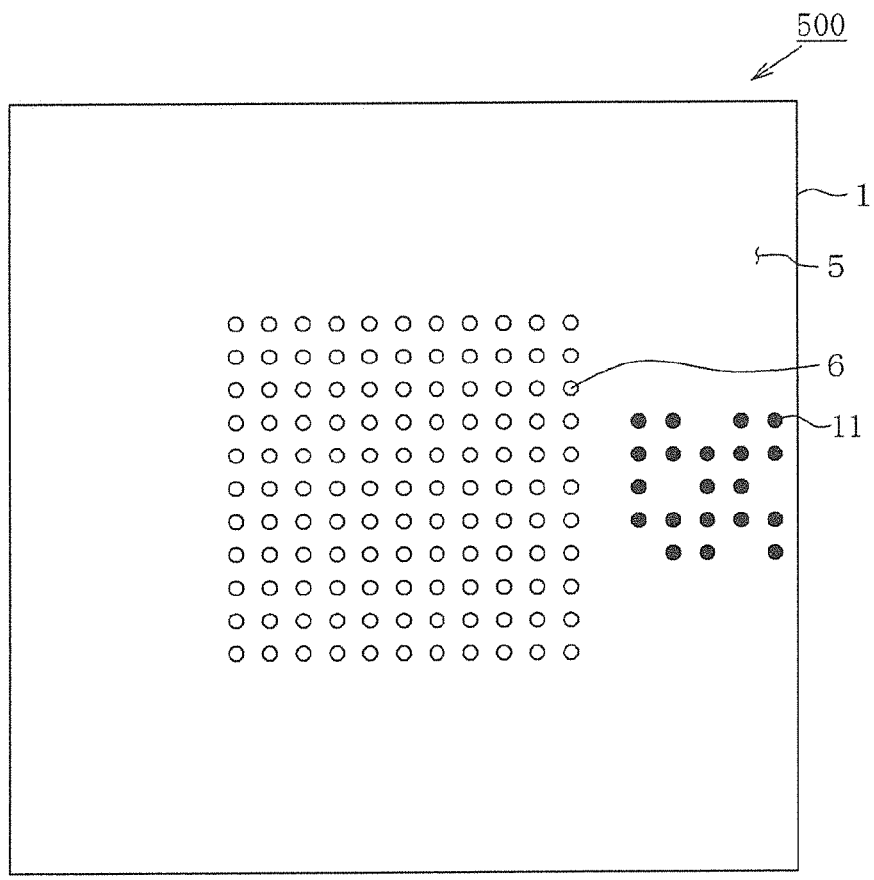
FIG. 5B is a schematic top view thereof.

As in a wiring board 500 according to a fifth embodiment shown in FIGS. 5A and 5B, all of the code information reading pads 11 may be electrically connected to the common conductor 12, and at least one of the code information reading pads 11 may be fully covered with the solder resist layer 5. Similarly to the wiring board 400 shown in FIGS. 4A and 4B, code information is recognized by reading the presence or absence of the solder resist layer 5 on the code information reading pad 11 with the image recognition device.

With the foregoing first to fifth embodiments, all of the code information reading pads 11 have the same circular shape and the same size. Alternatively, the code information reading pad 11 electrically connected to the common conductor 12 may differ from the code information reading pad 11 not electrically connected to the common conductor 12 in shape or size. This also makes it possible to recognize code information with a method other than detecting the presence or absence of the electrical connection between the code information reading pad 11 and the common conductor 12. That is, the code information is recognized by reading a difference in the shape or size of the code information reading pad 11 with the image recognition device.

These modifications are, of course, applicable to the wiring boards 200 and 300 according to the second and third embodiments shown in FIGS. 2A and 2B and FIGS. 3A and 3B, respectively.

What is claimed is:
1. A wiring board comprising:
an insulating board comprising a core insulating plate and an insulating layer laminated on at least one surface of the insulating plate,
wherein a plurality of code information reading pads formed of a conductor layer having an inherent code information are disposed on a surface of the insulating layer formed uppermost,
wherein a common conductor is disposed oppositely to the code information reading pads by interposing therebetween the insulating layer formed uppermost, and
wherein at least one of the code information reading pads and the common conductor are electrically connected to each other through a via conductor penetrating through the insulating layer formed uppermost.

2. The wiring board according to claim 1, wherein a plurality of the insulating layers are laminated on each of both surfaces of the core insulating plate.

3. The wiring board according to claim 1, wherein a plurality of the code information reading pads not electrically connected to the common conductor are covered with a solder resist layer.

4. The wiring board according to claim 1, wherein all of the code information reading pads are electrically connected to the common conductor, and at least one of the code information reading pads is covered with a solder resist layer.

5. The wiring board according to claim 1, wherein the code information reading pad electrically connected to the common conductor differs from the code information reading pad not electrically connected to the common conductor in shape or size.

6. The wiring board according to claim 1, wherein the code information reading pads are disposed collectively.

7. The wiring board according to claim 1, wherein the code information reading pads are disposed dispersedly.

8. The wiring board according to claim 1, wherein a plurality of semiconductor element connection pads to be flip-chip connected to an electrode terminal of a semiconductor element are disposed on the surface of the insulating layer formed uppermost, and a part of the semiconductor element connection pads constitutes the code information reading pads.

9. A method for recognizing a code information comprising:
providing a wiring board including an insulating board,
wherein the insulating board comprises a core insulating plate and an insulating layer laminated on at least one surface of the insulating plate,
wherein a plurality of code information reading pads formed of a conductor layer having an inherent code information are disposed on a surface of the insulating layer formed uppermost,
wherein a common conductor is disposed oppositely to the code information reading pads by interposing therebetween the insulating layer formed uppermost, and
wherein at least one of the code information reading pads and the common conductor are electrically connected to each other through a via conductor penetrating through the insulating layer formed uppermost; and
recognizing code information by detecting presence or absence of an electrical connection between the code information reading pad and the common conductor in the wiring board.

10. A method for recognizing a code information comprising:
providing a wiring board including an insulating board,
wherein the insulating board comprises a core insulating plate and an insulating layer laminated on at least one surface of the insulating plate, wherein a plurality of code information reading pads formed of a conductor layer having an inherent code information are disposed on a surface of the insulating layer formed uppermost, wherein a common conductor is disposed oppositely to the code information reading pads by interposing therebetween the insulating layer formed uppermost, and wherein at least one of the code information reading pads and the common conductor are electrically connected to each other through a via conductor penetrating through the insulating layer formed uppermost;

wherein a plurality of semiconductor element connection pads to be flip-chip connected to an electrode terminal of a semiconductor element are disposed on the surface of the insulating layer formed uppermost, and a part of the semiconductor element connection pads constitute the code information reading pads;

connecting the code information reading pads to the electrode terminal of the semiconductor element in the wiring board; and recognizing code information by taking presence or absence of an electrical connection between the code information reading pad and the common conductor, into the semiconductor element as data.

* * * * *